United States Patent
Rotondaro et al.

(10) Patent No.: US 6,919,251 B2
(45) Date of Patent: Jul. 19, 2005

(54) GATE DIELECTRIC AND METHOD

(75) Inventors: Antonio L. P. Rotondaro, Dallas, TX (US); Luigi Colombo, Dallas, TX (US); Malcolm J. Bevan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/210,421

(22) Filed: Jul. 31, 2002

(65) Prior Publication Data

US 2004/0023462 A1 Feb. 5, 2004

(51) Int. Cl.[7] .................. H01L 21/8238; H01L 21/336; H01L 21/31
(52) U.S. Cl. ...................... 438/287; 438/216; 438/275; 438/785; 438/788
(58) Field of Search ............................... 438/216, 275, 438/287, 785, 787, 788, 795

(56) References Cited

U.S. PATENT DOCUMENTS

| | | |
|---|---|---|
| 5,763,922 A | 6/1998 | Chau |
| 6,020,024 A | 2/2000 | Maiti et al. |
| 6,297,539 B1 | 10/2001 | Ma et al. |
| 6,306,742 B1 | 10/2001 | Doyle et al. |
| 6,682,973 B1 * | 1/2004 | Paton et al. ............... 438/240 |
| 2003/0129817 A1 * | 7/2003 | Visokay et al. ............. 438/591 |

FOREIGN PATENT DOCUMENTS

EP     0973189     1/2000

* cited by examiner

*Primary Examiner*—Alexander Ghyka
(74) *Attorney, Agent, or Firm*—Carlton H. Hoel; W. James Brady; Frederick J. Telecky, Jr.

(57) ABSTRACT

CMOS gate dielectric made of high-k metal silicates by passivating a silicon surface with nitrogen compounds prior to high-k dielectric deposition. Optionally, a silicon dioxide monolayer may be preserved at the interface.

10 Claims, 8 Drawing Sheets

GATE DIELECTRIC AND METHOD

BACKGROUND OF THE INVENTION

The present invention relates to semiconductor transistor fabrication and more particularly to complementary field effect transistors (CMOS) and integrated circuits containing them and methods of fabrication.

The trend in semiconductor integrated circuits to higher device densities by down-scaling structure sizes and operating voltages has led to silicon field effect (MOS) transistor gate dielectrics, typically made of silicon dioxide, to approach thicknesses on the order of 1–2 nm to maintain the capacitive coupling of the gate to the channel. However, such thin oxides present leakage current problems due to carrier tunneling through the oxide. Consequently, alternative gate dielectrics with greater dielectric constants to permit greater physical thicknesses have been proposed. Indeed, $Ta_2O_5$, $(Ba,Sr)TiO_3$, and other high dielectric constant materials have been suggested, but such materials have poor interface stability with silicon.

Wilk and Wallace, Electrical Properties of Hafnium Silicate Gate Dielectrics Deposited Directly on Silicon, 74 Appl. Phys. Lett. 2854 (1999), disclose measurements on capacitors with a hafnium silicate dielectric formed by sputtering deposition (at a pressure of $5 \times 10^{-6}$ mTorr and substrate temperature of 500° C.) of a 5 nm thick $Hf_6Si_{29}O_{65}$ ($Hf_{0.18}Si_{0.89}O_2$) layer directly onto silicon together with a gold top electrode deposition onto the silicate dielectric. Such capacitors showed low leakage current, thermal stability, an effective dielectric constant of about 11, and a breakdown field of 10 MV/cm.

However, high volume production of silicon integrated circuits with such high-k dielectrics has problems including initial stages of silicate deposition yielding a metal-poor interfacial layer. This layer typically has a k value smaller than that of the bulk silicate and causes an increase in the equivalent oxide thickness of the gate dielectric. Also, the interaction of the substrate with the process environment at during the early stages of silicate deposition causes the growth of an undesirable interfacial layer.

SUMMARY OF THE INVENTION

The present invention provides integrated circuit fabrication including high-k dielectric deposition onto an interface passivated for low oxygen diffusivity. Preferred embodiment passivations include remote plasma nitridation and low temperature ammonia annealing.

This has the advantages of simple fabrication of CMOS devices having gate dielectrics made of high-k material.

BRIEF DESCRIPTION OF THE DRAWINGS

The drawings are heuristic for clarity.

DESCRIPTION OF THE PREFERRED EMBODIMENTS

1. Overview

Preferred embodiment integrated circuits and MOS transistors include silicate high-k gate dielectrics fabricated with preferred embodiment methods which form a gate dielectric by deposition onto a silicon surface passivated through nitridation. This has benefits including the elimination of low-k oxide-type interfacial layers and the provision of a nucleation layer for subsequent high-k material deposition. This also provides control of the final thickness of the interfacial layer and yields a better nucleation surface for the silicate film deposition. Potentially effective oxide thicknesses of less than 1 nm can be achieved.

2. First Preferred Embodiment Methods

FIGS. 1a–1j illustrate in cross sectional elevation views the steps of first preferred embodiment fabrication methods for integrated circuits including field effect transistors (e.g., CMOS or BiCMOS) with high-k gate dielectrics and polysilicon gates. The preferred embodiments include the following steps:

(1) Substrate

Figure 1A:
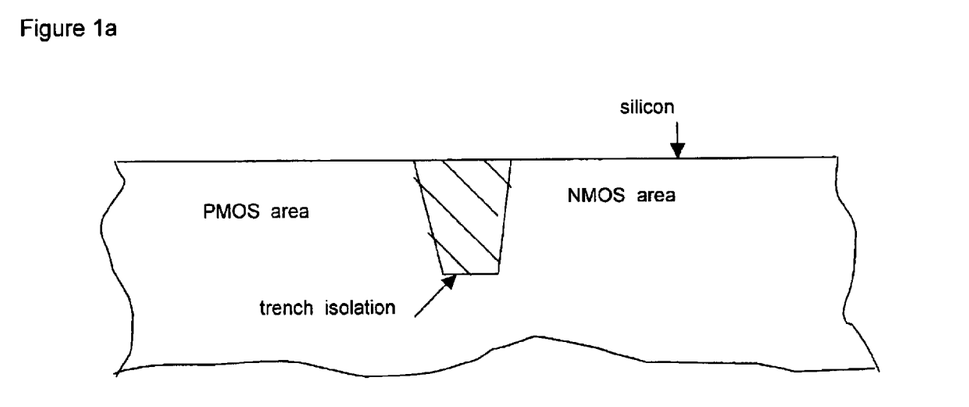
FIGS. 1a–1j are cross sectional elevation views of steps of a preferred embodiment integrated circuit fabrication method.

Start with a p-type silicon (or silicon-on-insulator) wafer 102 with <100> orientation and form shallow trench isolation by pad oxide growth, nitride deposition, trench pattern, nitride-oxide-silicon trench etch, trench surface oxidation, trench fill by blanket APCVD oxide deposition, etch-CMP planarization, and nitride strip. FIG. 1a is a cross-sectional elevation view of the substrate illustrating the trench isolation and locations for fabrication of NMOS and PMOS transistors.

Figure 1B:
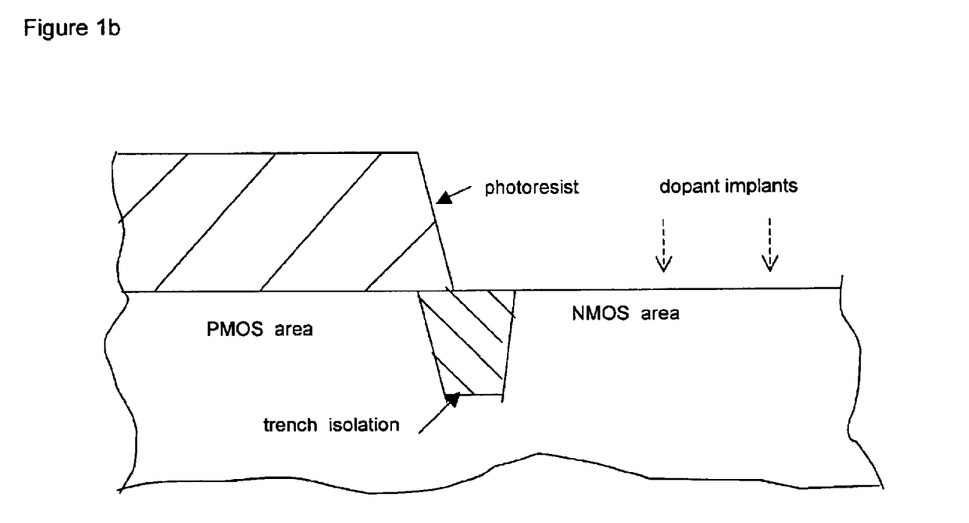

Next, perform multiple dopant implants to form n- and p-type wells (plus, optionally, memory cell array wells and bipolar device buried layers) plus form channel stop regions, punchthrough deterrence regions, and threshold adjust regions. These implants are performed through the residual pad oxide. FIG. 1b illustrating the masked NMOS transistor location implants; a similar masked implant occurs in the PMOS locations. Note that the implant doses and depths may differ for memory cell array transistors as compared to peripheral transistors. Also, both high and low voltage transistors of the same type may be formed and may have different implant doses and depths. A rapid thermal anneal (e.g., 1050° C. for 30 s) activates and diffuses the implanted dopants (e.g., boron and phosphorus).

(2) Surface Passivation

Expose the silicon in the locations for NMOS and PMOS transistors (and bipolars if included) by deglazing any native oxide in an HF-containing solution. Next, passivate the silicon surface prior to deposition of high-k gate dielectric to avoid the formation of a low-k layer at the dielectric-silicon interface. A low-k layer can arise from reaction of oxygen from the deposition ambient with the silicon surface to essentially form $SiO_2$ and/or a Si-rich metal silicate. A first preferred embodiment passivation method grows about two monolayers of silicon nitride by remote plasma nitridation. In particular, excite $N_2$ at a pressure of 4 Pa (30 mTorr) into a plasma by microwave power (e.g., 1500 W at 2 GHz) in a cavity remote from the substrate and transport excited neutral $N_2$ molecules ($N_2^*$) and excited neutral nitrogen atoms ($N^*$) generated in the plasma to the silicon surface. The reaction of the excited species with the surface silicon:

$$Si+N_2^* \rightarrow Si_3N_4$$

is self-limited for substrate temperatures less than 700° C. The nitridation is limited to form only about two monolayers of silicon nitride; this thickness suffices to deter the oxygen reaction with underlying silicon but might affect the channel mobility.

An alternative preferred embodiment nitride passivation of the silicon surface anneals a thin surface oxide in an ammonia atmosphere. In particular, grow a silicon dioxide layer of 1–2 nm thickness by immersion of the substrate in a water solution of $H_2SO_4$ and $H_2O_2$ at 90° C. for 300 seconds, or a solution of $H_2O_2$ and $H_2O$ at 65° C. for 300 seconds, or a solution of $H_2O$ and $O_3$ at 50° C. fo 300 seconds, or in an ozone or oxygen atmosphere with ultraviolet activation. Then anneal the oxidized substrate at 450° C. for 60 seconds in an atmosphere of $NH_3$. The ammonia penetrates the oxide and a silicon nitride layer forms at the substrate interface and the remaining oxide incorporates nitrogen to become an Si—O—N compound. This surface passivation again is tuned to grow roughly two monolayers of silicon nitride and thereby prevents the interaction of the substrate with the process environment and avoids the formation of a thick $SiO_2$ interface layer.

Figure 1C:
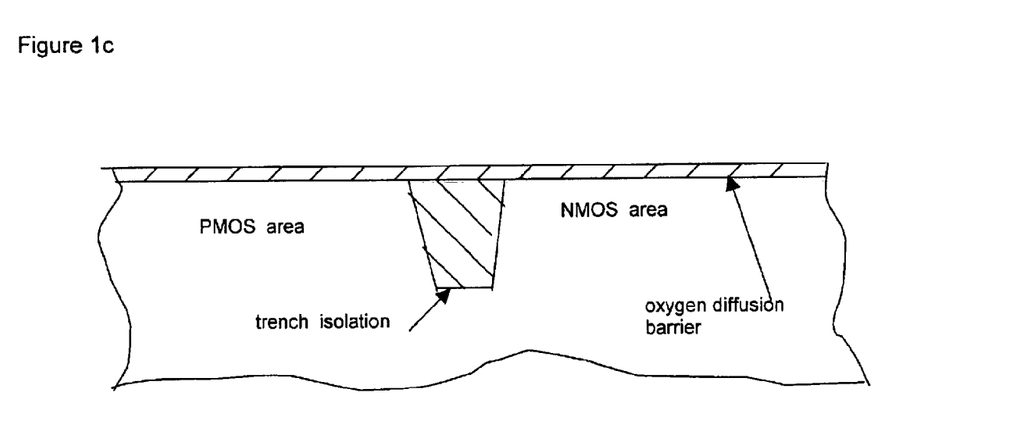

Optionally, reoxidize the nitrided oxide (e.g., with $N_2O+H_2$, $NO+H_2$, $O_2$, or $O_2+H_2$ at 950° C. for 10 seconds) and thereby regrow oxide (1–2 monolayers) at the silicon interface to reestablish channel carrier mobility. This essentially yields an oxide/nitride/oxide stack of total thickness 1.8 nm. Alternatively, strip the oxide off the nitride with dilute HF to have nitride passivation. FIG. 1c illustrates a generic oxygen diffusion barrier on the silicon surface.

(3) Gate Dielectric Formation

Figure 1D:
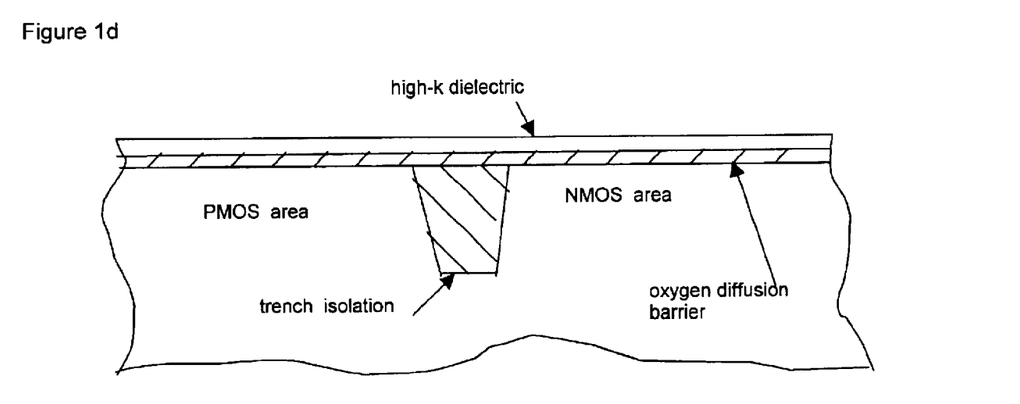

Deposit high-k (i.e., dielectric constant greater than 10) dielectric material by PVD, CVD, LPCVD, ALD, etc. to yield a final high-k gate dielectric with thickness in the range 2.5–7 nm. The deposited high-k dielectric can be a metal oxide, a metal oxynitride, a metal silicate, a metal silicon nitride, and so forth. The high-k dielectric could be non-stoichiometric, such as $Hf_wSi_xO_y$ with $y<2(w+x)$. Such a silicate (for w/x on the order of ⅓) has an effective dielectric constant of roughly 14, so a 2.5–7 nm thick silicate has an equivalent silicon dioxide thickness of 0.8–2 nm but not the leakage (tunneling) current of such a thin silicon dioxide gate dielectric. Also, after deposition the non-stoichiometric hafnium silicate dielectric layer could be nitrided and thereby compensate for oxygen vacancies. That is, the resultant dielectric material may generally be $Hf_wSi_xO_yN_z$ with the composition roughly stoichiometric but not easily crystallizable. FIG. 1d shows the high-k dielectric layer on the oxygen diffusion barrier layer.

Figure 1E:
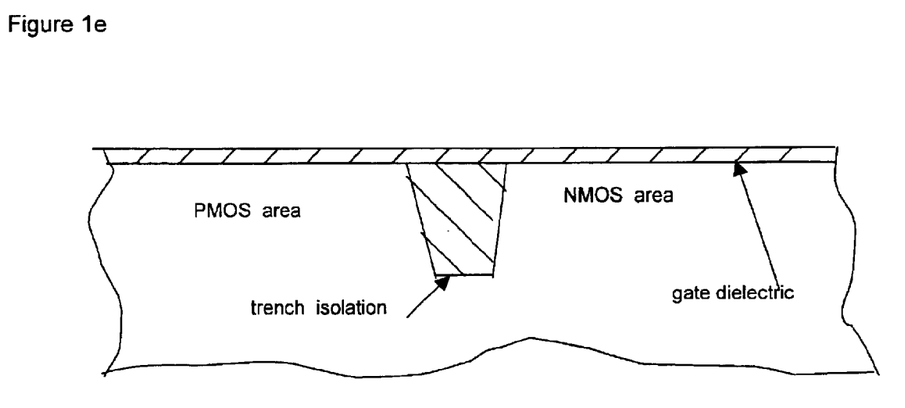

After the deposition of the bulk high-k dielectric the dielectric stack (e.g., deposited high-k and silicon nitride (oxide) monolayers) can be treated in a combination of high temperature (>600° C.) anneal in non-oxidizing ambient aiming for material densification, and low temperature (<900° C.) anneal in oxidizing ambient aiming for reducing the number of defects in the stack and/or to eventually complete the desired stoichiometry of the films. These post-deposition treatments can include plasma excited species, ultraviolet light excited species, and even exposure to liquids of oxidizing behavior. FIG. 1e shows the resultant gate dielectric as a single layer.

Figure 1F:
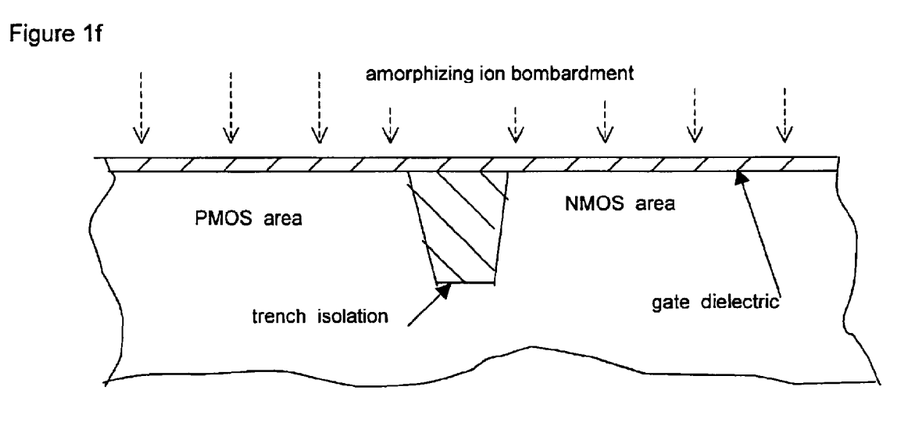

Optionally, the amorphous character of the high-k gate dielectric layer may be ensured by a low energy ion implantation as illustrated in FIG. 1f. The ions may come from a plasma with bias on the order of 500 volts relative to the high-k gate dielectric.

(3') Split Gate Dielectric Option

Various integrated circuits include both high voltage and low voltage transistors; that is, MOS transistors with differing operating voltages such as differing maximum source-drain voltages and gate-source voltages. For example, a high voltage transistor could be used for peripheral transistors or programmable transistors, and low voltage transistors used for central processor or memory array transistors to limit power consumption and heat generation. High voltage MOS transistors require a thicker gate dielectric than low voltage MOS transistors in order to avoid breakdown. A modification of the foregoing step (3) can provide for two or more transistor gate dielectric thicknesses through various approaches. For example, first grow a thin silicon dioxide layer; next, strip this oxide layer in areas for low voltage transistors; then perform passivation and high-k dielectric deposition of step (3) with dielectric thicknesses targeted for the low voltage transistors. The unremoved initially-grown oxide under the nitrogen-based passivation and high-k dielectric in the areas for high voltage transistors provides the required extra dielectric thickness.

(4) Gate Material Deposition

Figure 1G:
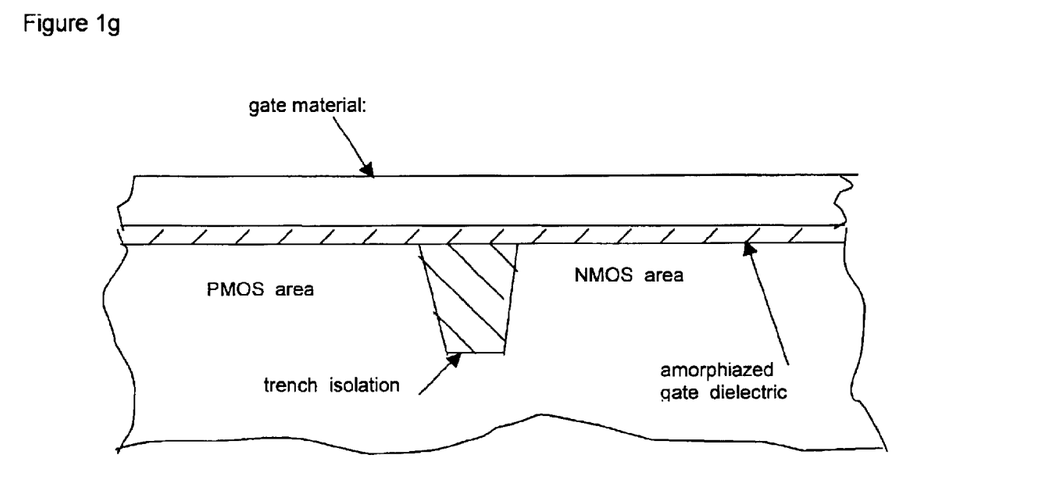
Figure 1H:
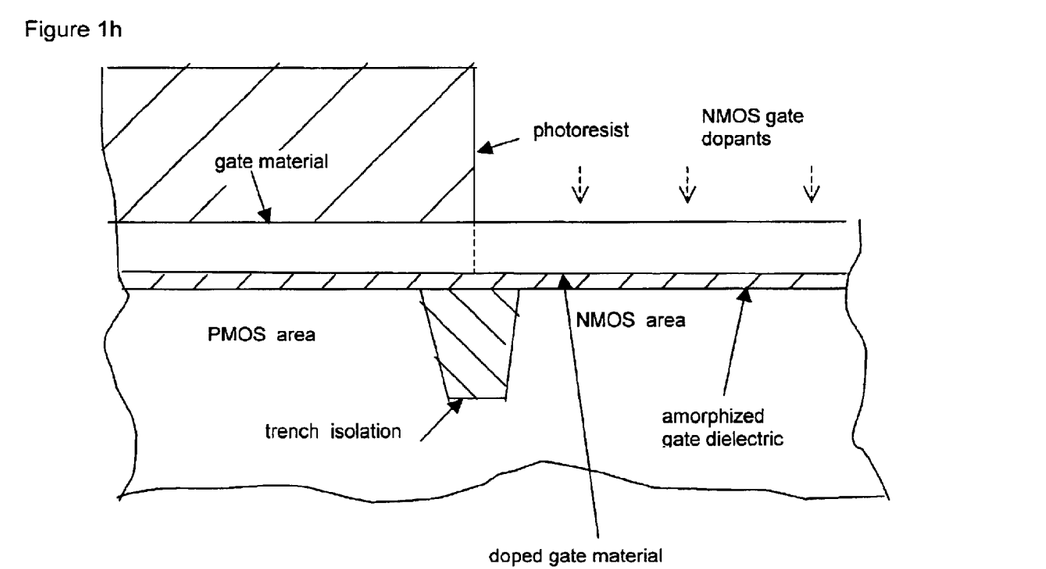

Deposit a layer of amorphous silicon, polysilicon, or poly Si—Ge gate material of thickness 80–200 nm on the treated high-k gate dielectric; see FIG. 1g. The deposition may be low temperature decomposition of silane. Then dope the gate material n and p type in the NMOS and PMOS areas, respectively, by non-critical photoresist masking and dopant implantations; see FIG. 1h. (Polysilicon emitters for npn bipolars would be in the n type area.)

(5) Gate Mask and Etch

Spin on a layer of photoresist which is sensitive to deep ultraviolet; optionally, an antireflective coating (ARC) layer could be deposited prior to the photoresist in order to limit interference effects during photoresist exposure. The composition of the ARC and thickness are selected according to the exposure wavelength and the reflectivity of the underlying material. Expose the photoresist through a reticle for gates and gate level interconnects; the exposed minimal linewidth may be about 50 nm. Lastly, develop the photoresist and strip exposed ARC, if any.

Figure 1I:
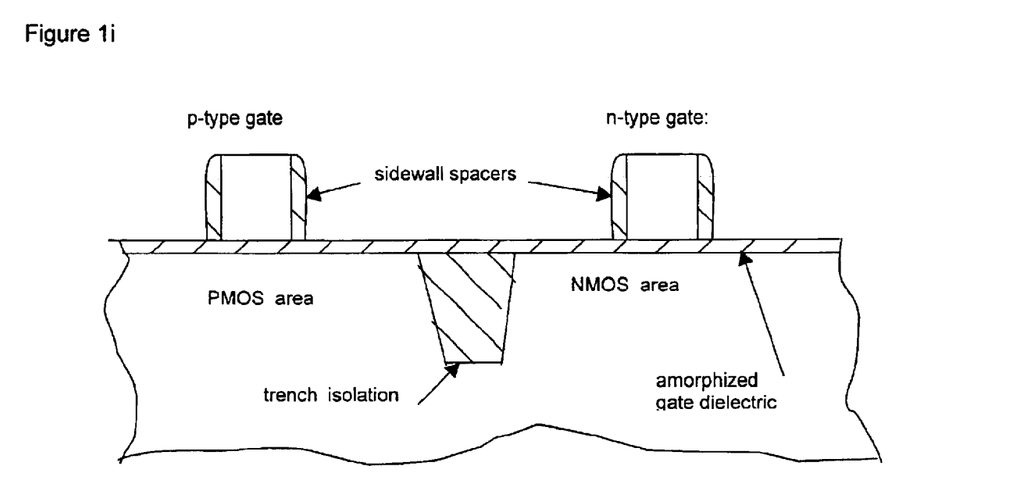

Use the patterned photoresist as an etch mask for the anisotropic RIE or high-density plasma etch of the gate material (doped amorphous silicon) to form gates and gate level interconnects. The etch may be a two (or more) step process with an initial fast etch (such as a fluorine-based etchant source) followed by a chlorine or bromine-based etchant source which is selective to silicon dioxide and the high-k gate dielectric material; for example HBr plus oxygen. If the gate etch erodes the photoresist, the underlying ARC layer provides sufficient etch masking. Gates are 100 nm high and 30 nm long (FIG. 1i is a cross section along the gate length, and gates typically have widths much greater than their lengths).

(6) Source/Drains

Next, form sidewall spacers on the gates (and gate level interconnects) by a blanket conformal deposition of spacer material (such as 20 nm of silicon nitride or silicon dioxide) followed by anisotropic etch back to remove the spacer material from horizontal surfaces. FIG. 1i also illustrates the resulting sidewall spacers.

Implant dopants to form source/drain regions using the gates plus sidewall spacers as self-aligning masks. As before, use a non-critical mask on the NMOS regions during PMOS source/drains implant and a non-critical mask on the PMOS regions during NMOS source/drains implant. The exposed high-k gate dielectric material can first be etched off, or the implants can be through any exposed high-k gate dielectric material over the source/drain regions. For lightly-doped drains, use first implants after gate formation but prior to sidewall spacer formation.

(7) Interlevel Dielectric and Contacts

Figure 1J:
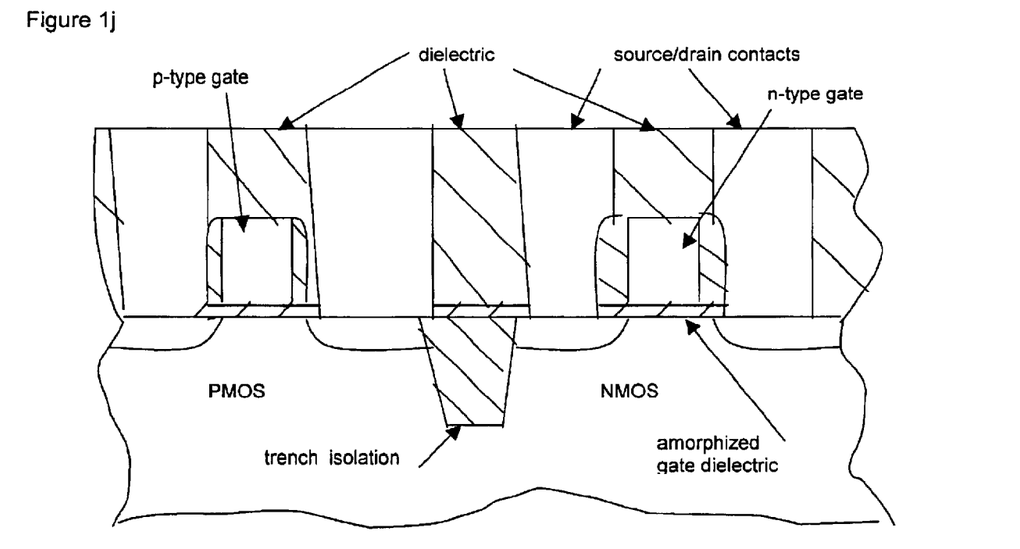

FIG. 1j illustrates subsequent structure after deposition of a first interlevel dielectric and formation of contacts to source/drains. The integrated circuit fabrication continues with further levels of dielectrics and interconnects.

3. Clad Gates

Figure 2:
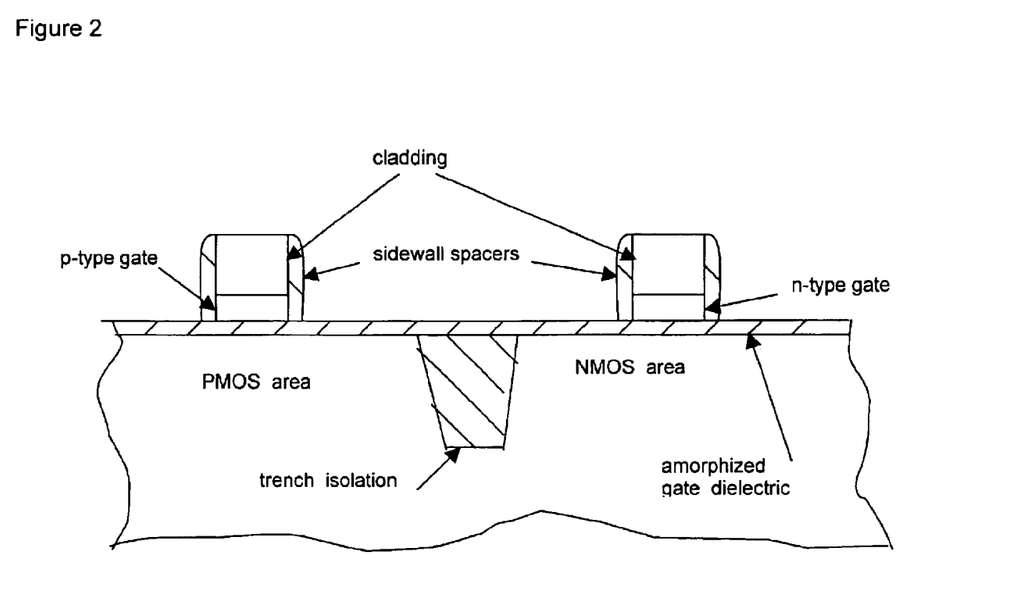
FIG. 2 shows in cross sectional elevation view a second preferred embodiment.

Further, the gates could be clad with a metal or metal silicide to increase conductivity; see FIG. 2. The cladding would be deposited or formed after the gate doping in step (4) but prior to the gate formation in step (5). Of course, the gate etch could include separate steps for etching the cladding and the silicon.

4. Disposable Gate Preferred Embodiments

Figure 3A:
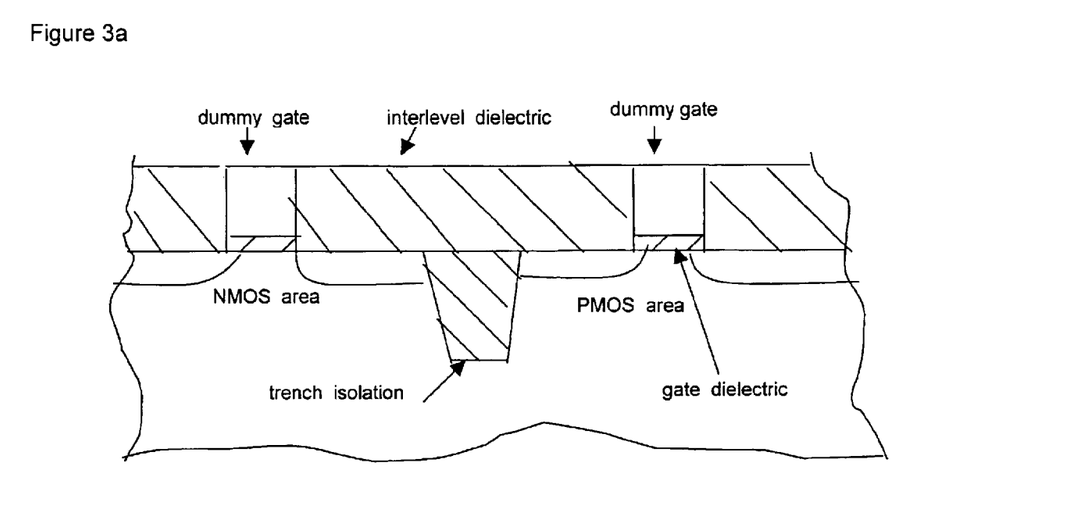
FIGS. 3a–3c illustrate a dummy gate preferred embodiment.
Figure 3B:
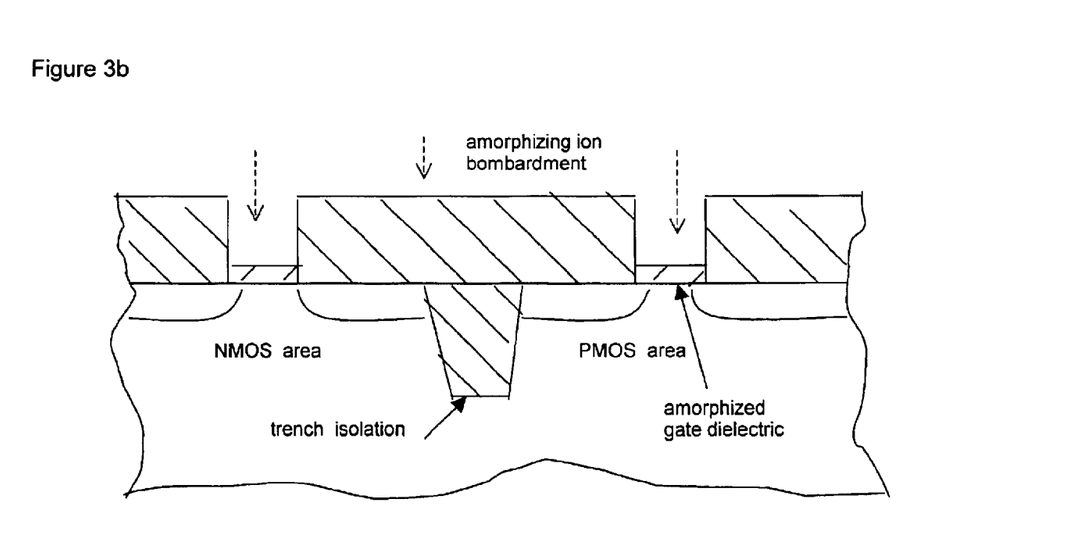
Figure 3C:
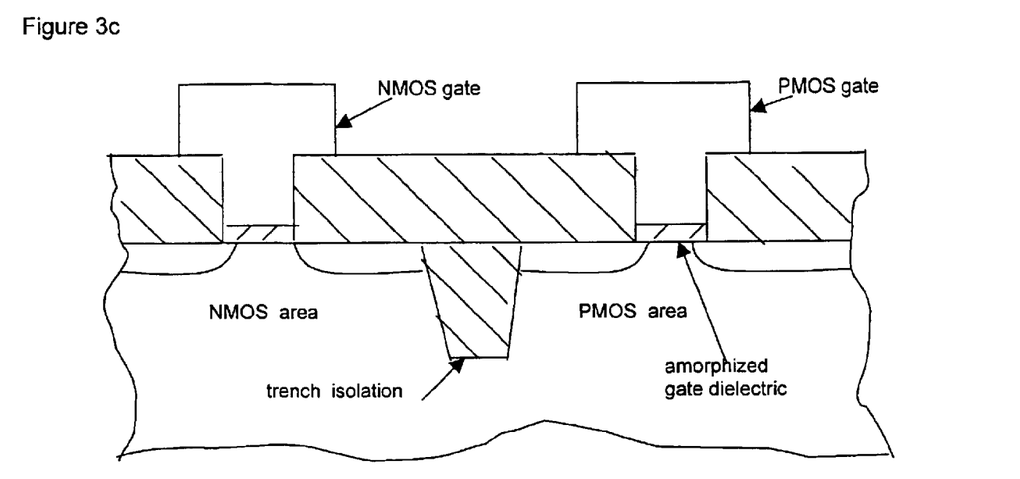

FIGS. 3a–3c illustrate a preferred embodiment disposable (dummy) gate method of integrated circuit fabrication which uses a preferred embodiment high-k gate dielectric formation plus optional amorphization. In particular, follow the steps (1)–(5) of the foregoing preferred embodiment but without doping the polysilicon gate material to have a (undoped) polysilicon dummy gate (sidewall spacers are optional and have been omitted) and source/drains formed in the substrate. The high-k gate dielectric layer may have been amorphized as in step (3) or the amorphization may be deferred until after removal of the dummy gates or may be performed at both times.

Deposit 200-nm-thick interlevel dielectric (premetal dielectric), such as TEOS oxide, and planarize the resulting structure, such as by CMP, to expose the top of the polysilicon dummy gate. FIG. 3a shows dummy gates which may be about 200 nm high and 50 nm long.

Etch out the dummy gates with an HBr+$O_2$ plasma which stops on the gate dielectric layer to leave grooves in the interlevel dielectric layer. The exposed high-k gate dielectric at the bottoms of the grooves can then be amorphized as illustrated in FIG. 3b.

Next, blanket deposit a gate material, such as polysilicon (or polysilicon plus metal (which may differ for NMOS and PMOS) for eventual silicidation) to fill the bottoms of the grooves plus cover the planarized dielectric; the gate material may be thin (e.g., 30–50 nm) for easy modification or thick (e.g., 50+ nm) to form different work function gates for NMOS and PMOS, such as by non-critical patterning with photoresist and implanting.

Spin on and pattern photoresist to define a gate top of length 250 nm, and use the patterned photoresist to etch gate material to form T-shaped gate; see FIG. 3c.

Continue as in foregoing to form interlevel dielectrics and interconnects.

5. Modifications

The preferred embodiments can be modified in various ways while retaining the feature of high-k gate dielectric formed on a passivation layer which acts as an oxygen diffusion barrier.

For example, the silicon surface could be modified to be a silicon germanium alloy in the PMOS areas, this will help increase hole mobility and PMOS performance.

What is claimed is:

1. A method of fabrication of field effect devices, comprising the steps of:

(a) forming a first layer of oxygen diffusion barrier on a silicon surface;

(b) forming a monolayer of silicon oxide at the interface of said first layer and said silicon surface;

(c) forming a second layer of high-k dielectric material on said first layer;

(d) forming gates on said second layer.

2. The method of claim 1, wherein:

said forming of step (b) of claim 1 includes high temperature diffusion of oxygen through said first layer oxygen-diffusion barrier.

3. The method of claim 1, wherein:

after step (c) of claim 1, anneal to reduce the number of defects.

4. The method of claim 1, wherein:

said high-k dielectric of step (c) of claim 1 is selected from the group consisting of silicates, oxides, nitrides, oxynitrides, and nitride-silicates of any of Hf, Zr, Al, Ti, La, Pr, Y, Gd, Eu, Ta, and alloys thereof.

5. The method of claim 1, further comprising the step of:

after said forming of step (c) of claim 1, amorphazing said second layer by ion bombardment.

6. A method of fabrication of field effect devices, comprising the steps of:

(a) forming two monolayers of silicon oxide on a silicon surface;

(b) forming a first layer of oxygen diffusion barrier at the interface of said silicon oxide layer and said silicon surface;

(c) forming a second layer of high-k dielectric material on said silicon oxide layer;

(d) forming gates on said second layer.

7. The method of claim 6, wherein:

said forming of step (b) of claim 6 is by exposure of said silicon oxide surface to nitrogen-containing species.

8. The method of claim 6, wherein:

after step (c) of claim 6, anneal to reduce the number of defects.

9. The method of claim 6, wherein:

said high-k dielectric of step (c) of claim 6 is selected from the group consisting of silicates, oxides, nitrides, oxynitrides, and nitride-silicates of any of Hf, Zr, Al, Ti, La, Pr, Y, Gd, Eu, Ta, and alloys thereof.

10. The method of claim 6, further comprising the step of:

after said forming of step (c) of claim 6, amorphizing said second layer by ion bombardment.

* * * * *